United States Patent [19]
Yaung et al.

[11] Patent Number: 6,071,798
[45] Date of Patent: *Jun. 6, 2000

[54] METHOD FOR FABRICATING BURIED CONTACTS

[75] Inventors: Dun-Nian Yaung, Taipei; Shou-Gwo Wuu; Jin-Yuan Lee, both of Hsin-Chu; Jhon-Jhy Liaw, Taipei, all of Taiwan

[73] Assignee: Taiwan Semiconductor Manufacturing Company, Hsin-Chu, Taiwan

[*] Notice: This patent is subject to a terminal disclaimer.

[21] Appl. No.: 09/156,361

[22] Filed: Sep. 18, 1998

[51] Int. Cl.$^7$ ................................. H01L 21/425
[52] U.S. Cl. ...................... 438/526; 438/533; 438/586; 438/637; 438/638; 438/639; 438/652
[58] Field of Search ..................... 438/526, 533, 438/586, 637–639, 652

[56] References Cited

U.S. PATENT DOCUMENTS

| | | | |
|---|---|---|---|
| 5,258,096 | 11/1993 | Sandhu et al. | 156/643 |
| 5,607,881 | 3/1997 | Huang | 437/195 |
| 5,668,051 | 9/1997 | Chen et al. | 438/558 |
| 5,705,437 | 1/1998 | Wu et al. | 438/238 |
| 5,721,146 | 2/1998 | Liaw et al. | 437/26 |
| 5,726,932 | 3/1998 | Lee et al. | 365/154 |

Primary Examiner—John F. Niebling
Assistant Examiner—David A. Zarneke
Attorney, Agent, or Firm—George O. Saile; Stephen B. Ackerman; William J. Stoffel

[57] ABSTRACT

The present invention provides a novel method for fabricating a buried contact extending under the first conductive layer 16 and subjacent first insulating layer 14. A first insulating layer 14 and a first conductive layer are formed over a silicon substrate 10 having isolation structures 12. A photoresist mask 18A having a buried contact opening 20 is formed over the first conductive layer. The first conductive layer 16 and the first insulating layer 14 are etched through the photoresist mask 18A. A width 21 of the photoresist mask 18A adjacent to the buried contact opening 20 is removed using a descum process, thereby forming an expanded opening 20A and an exposed ring 16A of the first conductive layer 16 with subjacent first insulating layer 14. Impurity ions 23 are implanted through the expanded opening 20A at a sufficient energy level to form a novel buried contact region 22 comprising an extended buried contact region 22A extending under the exposed ring 16A of the first conductive layer 16 and an exposed area 22B where the first conductive layer and the first insulating layer were removed. The photoresist mask 18A is removed. A second conductive layer 24 and a polycide layer 26 are formed over the first conductive layer 16 and over the exposed area 22B of the buried contact region 22. The polycide layer 26, the second conductive layer 24, the first conductive layer 16 and the first insulating layer 14 are patterned to form a second opening 30 partially overlapping the extended buried contact region and defining a gate structure 31 and a contact structure 33. Lightly doped source/drain regions 32, sidewall spacers 34, and source/drain structures 38 are formed.

12 Claims, 3 Drawing Sheets

METHOD FOR FABRICATING BURIED CONTACTS

BACKGROUND OF THE INVENTION

1) Field of the Invention

This invention relates generally to fabrication of semiconductor devices and more particularly to the fabrication of buried contacts.

2) Description of the Prior Art

Buried contacts are well known in the fabrication of semiconductor devices. However, conventional processes have the problem of the buried contact trench that causes electrical shorts in the buried contact. Buried contact trenches occur when photoresist masks are misaligned and trenches are etched into the substrate in the buried contact region.

A conventional sequence of steps for forming a buried contact follows. A silicon substrate is provided having isolation structures and a gate oxide. A thin layer of doped polysilicon is formed over the gate oxide. Photoresist is applied, and openings are patterned defining areas for the buried contacts. Using reactive ion etching (RIE), the polysilicon and gate oxide are removed in the areas of the openings in the photoresist. A buried contact region is formed by ion implantation. A second polysilicon layer is formed. This layer is typically doped in-situ. Next, a second photoresist mask is patterned defining a polysilicon gate region and the buried contact region. A second opening is formed in the polysilicon and gate oxide in the area between the polysilicon gate and the buried contact not masked by photoresist, using REI. A lightly doped drain (LDD) is formed by ion implantation through the second opening.

Mask mis-alignment in either direction will have a significant detrimental effect. If the second mask is misaligned so as to expose a portion of the substrate where the gate oxide has been removed by the previous etch, a troublesome buried contact trench will be formed in the buried contact. A buried contact trench has the potential to cause an open or high resistance contact, especially in shallow implanted devices. If the second mask is misaligned so as to leave a gap between the second opening and the buried contact, an un-doped area will remain between the buried contact and the LDD causing parasitic resistance.

One approach to overcoming the buried contact trench is disclosed by Liaw et al. (U.S. Pat. No. 5,721,146), whereby a trench is formed in the substrate through the first opening, allowing for formation of a much deeper buried contact. Liaw's invention is less suceptable to the effects of a buried contact trench, but it does not prevent formation of a buried contact trench. Also, it does little to mitigate the effects of an un-doped contact area gap caused by misalignment of the second mask away from the first mask.

Another approach to overcome the detrimental effects of mask misalignment in buried contact formation is disclosed by Huang (U.S. Pat. No. 5,607,881), whereby, following LDD implantation, an additional photoresist mask is patterned with an opening that has been sized up from the original buried contact mask. An extra ion implantation is performed which either underlies the buried contact trench or penetrates the previously un-doped contact area gap. Again, this process does not prevent buried contact trench formation. Also, an expensive photolithography step is added to the process.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Patents

| | |
|---|---|
| 5,705,437 | Wu et al. |
| 5,626,932 | Lee et al. |
| 5,607,881 | Huang |
| 5,721,146 | Liaw et al. |
| 5,668,051 | Chen et al. |
| 5,258,096 | Sandhu et al. |

SUMMARY OF THE INVENTION

It is an object of the present invention to provide a method of forming a buried contact structure wherein a trench will not be formed in the buried contact.

It is another object of the present invention to provide a method of manufacturing a buried contact that is sufficently robust so as not to be detrimentally affected by mask misalignment inherent in multiple mask processes.

It is yet another object of the present invention to provide an economical and manufacturable process for manufacturing semiconductor devices with buried contacts.

To accomplish the above objectives, the present invention provides a novel method for fabricating a buried contact. The key features of the invention are:

(1) enlarging the buried contact opening 20 in the photoresist using a descum process that allows an enlarged buried contact region 22A & 22B in FIG. 3; and (2) a high energy buried contact implant process that implants impurity ions 23 through an exposed ring 16A of the first conductive layer 16 and subjacent first insulating layer 14 (see FIG. 3) to form a buried contact region 22 extending under the exposed ring 16A of the first conductive layer 16 and subjacent first insulating layer 14.

The method begins by forming isolation structures 12 on a silicon substrate 10 as shown in FIG. 1. A first insulating layer 14 is formed over the silicon substrate 10. A first conductive layer 16 is formed over the insulating layer 14. A photo resist layer 18 (PR) is formed over the first conductive layer 16 and patterned to form a photoresist mask 18A having a buried contact opening 20. The first conductive layer 16 and the first insulating layer 14 are removed in areas not covered by the photoresist mask 18A.

In the first key step, illustrated in FIG. 2, a width 21 of the photoresist mask 18A adjacent to the buried contact opening 20 is removed using a descum process, thereby forming an expanded opening 20A and an exposed ring 16A of the first conductive layer 16 with subjacent first insulating layer 14.

In the second key step, illustrated in FIG. 3, impurity ions 23 are implanted through the expanded opening 20A at a sufficient energy level to penetrate the exposed ring 16A of the first conductive layer 16 and subjacent first insulating layer 14, thereby forming a novel buried contact region 22. The buried contact region 22 consists of:

(a) an unexposed area 22A extending under the exposed ring 16A of the first conductive layer 16; and (b) an exposed area 22B in the expanded opening 20A.

The photoresist mask 18A is removed. A second conductive layer 24 is formed over the first conductive layer 16 and on the exposed area 22B of the buried contact region 22. A polycide layer 26 is formed on the second conductive layer 24.

The polycide layer 26, the second conductive layer 24 and the first conductive layer 16 are patterned to form a second opening 30 using the first insulating layer 14 as an etch stop. The second opening 30 defines a gate structure 31 and a contact structure 33. The first insulating layer 14 is removed in the second opening 30. Lightly doped source/drain regions 32 are formed by implanting ions through the second opening 30.

Spacers 34 are formed on the sidewalls of the gate structure 31 and the contact structure. Ions are implanted to form source/drain structures 38.

Benefits

The present invention provides a method of fabricating a buried contact, free of any buried contact trench. The shorting and high resistance problems associated with reduced or no contact area are eliminated, not merely compensated for.

The present invention provides a method of fabricating buried contact semiconductor devices that is particularly robust with respect to mask misalignment. Because the buried contact 22 extends under the first insulating layer 14 and the first conductive layer 16, it is impervious to overetching. Because the buried contact 22 extends past where the buried contact 22 and the LDD 32 connect, it is not affected by the alignment tolerances inherent in multiple mask processes.

By using the novel descum step (FIG. 3) and a high energy ion implant, the present invention provides a method to extend a buried contact 22 under the adjacent unetched areas of the first insulating layer 14 and first conductive layer 16. Furthermore, this process does not require any additional photolithography steps.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings.

Figure 1:
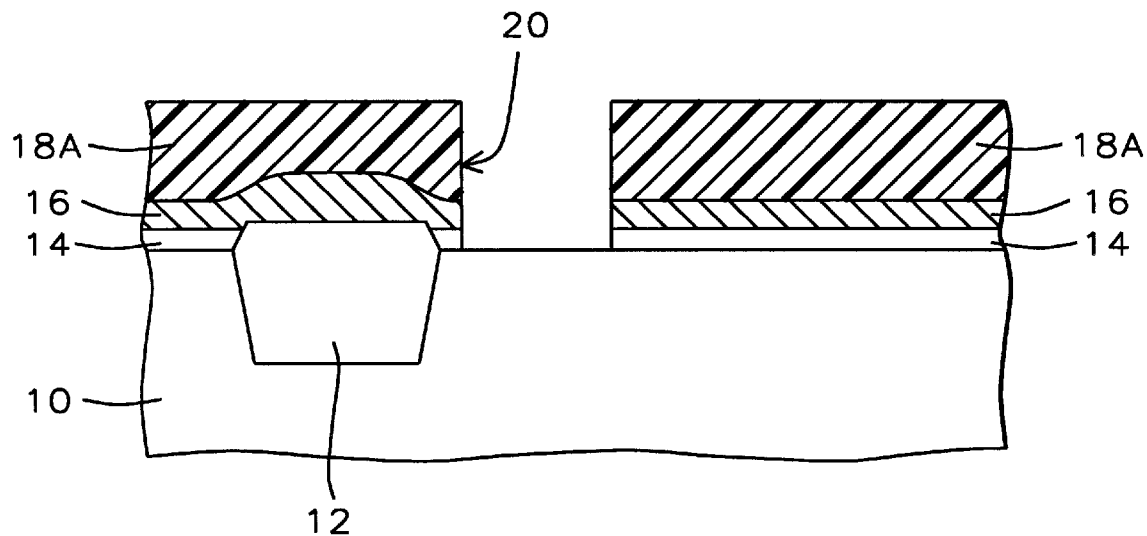
FIGS. 1,2,3,4,5 & 6 illustrate sequential sectional views of a novel process for fabricating buried contacts in a semiconductor device.

Referring to FIG. 1, the process begins by forming isolation structures 12 in a silicon substrate 10. Preferably, the isolation structures are shallow trench isolations STI as are well known in the art. Next, a first insulating layer 14 is formed over the silicon substrate 10. The first insulating layer 14 is preferably composed of silicon oxide ($SiO_2$) having a thickness in a range between about 60 Å and 80 Å. The first insulating layer can be formed using a chemical vapor deposition process (CVD) or preferably using a thermal oxidation process as is well known in the art.

Still referring to FIG. 1, a first conductive layer 16 is formed over the first insulating layer 14. The first conductive layer is preferably composed of polysilicon formed by low pressure chemical vapor deposition (LPCVD) to a thickness in a range between about 500 Å and 700 Å.

A photoresist mask 18A is formed overlying the first conductive layer 16 using conventional photolithographic techniques. The photoresist mask 18A has a buried contact opening 20. Next, the first conductive layer 16 and the first insulating layer 14 are etched away where they are not covered by the photoresist mask 18A, thereby exposing a region of the substrate 10. The first conductive layer 16 is preferably etched to the underlying gate oxide 14 using a reactive ion etch (REI) with chlorine. The gate oxide 14 is then removed by hydrofluoric acid dip or preferably by REI with tetrafluoromethane ($CF_4$).

Descum Step

Figure 2:
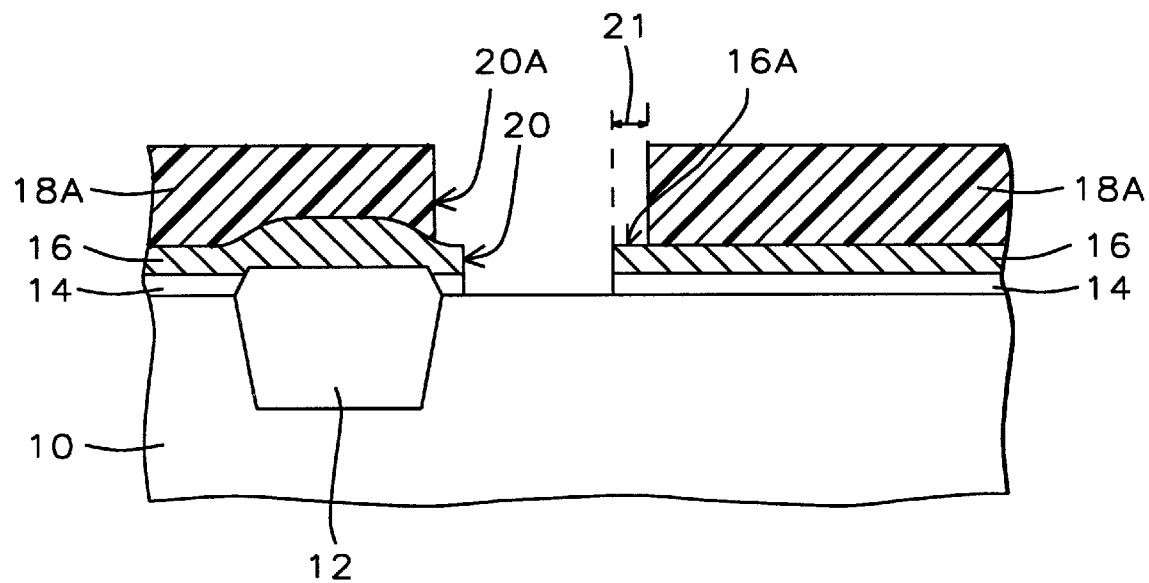

In a key step, as illustrated in FIG. 2, a width of the photoresist mask 18A adjacent to the buried contact opening 20, is removed using a descum process, thereby forming an expanded opening 20A. The descum process is an isotropic etch that can be performed using an $O_2$ plasma etch for a time in the range between about 15 seconds and 45 seconds at a pressure in the range between 100 mTorr and 1 Torr. The descum process removes a width 21 of the photoresist mask 18A. The width 21 is in the range between about 0.02 $\mu$m and 0.03 $\mu$m. The descum process leaves an exposed ring 16A of the first conductive layer 16 with subjacent first insulating layer 14 at the bottom of the expanded opening 20A.

High Energy Ion Implant

Figure 3:
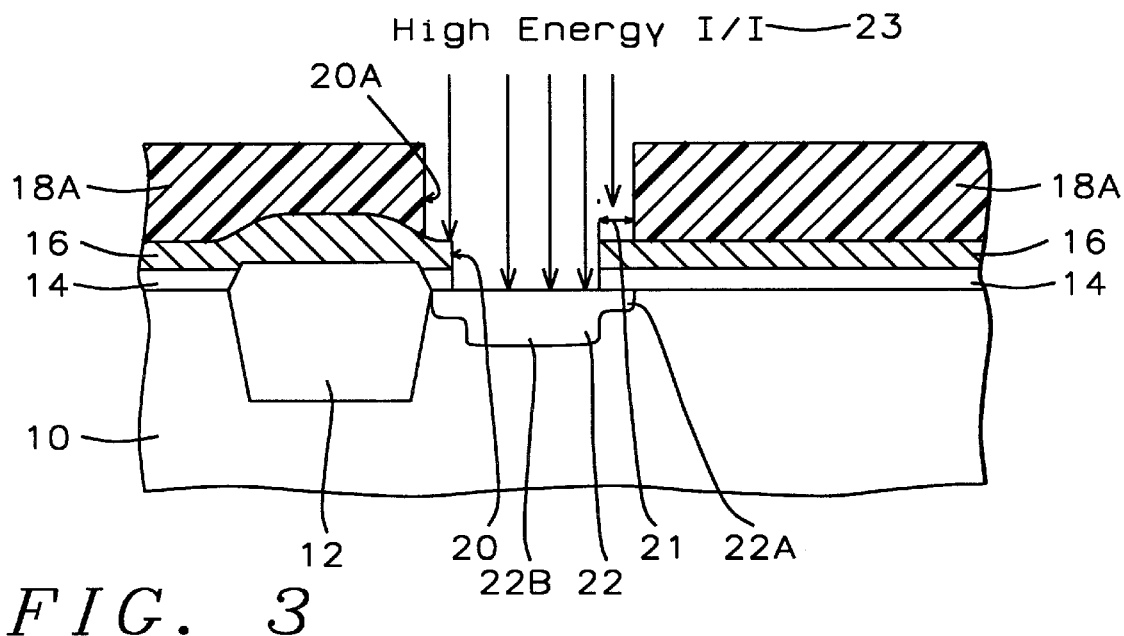

In a second key step, illustrated in FIG. 3, impurity ions 23 are implanted through the expanded opening 20A to form a buried contact region 22 having a novel extended region 22A. The second ion implant is performed at a sufficient energy level to penetrate the exposed ring 16A of the first conductive layer 16 and the subjacent first insulating layer 14, thereby forming the extended region 22A of the buried contact region 22 underlying the exposed ring 16A of the first conductive layer 16 and the subjacent first insulating layer. The impurity ions 23 are preferably P ions implanted at a dose in the range between about $10^{14}$ atoms/cm$^2$ and $10^{15}$ atoms/cm$^2$ at an energy in the range between about 70 KeV and 90 KeV.

Novel Buried Contact Region

The novel buried contact region 22 includes an unexposed extended region 22A extending under the first insulating layer 14 and the first conductive layer 16 and an exposed area 22B where the first conductive layer 16 and the first insulating layer 14 have been removed. The distance that the unexposed extended region area 22A of the novel buried contact region 22 extends under the first insulating layer 14 and the first conductive layer 16 is sufficient to account for mask alignment tolerances. The extended buried contact region 22A preferably has a width in the range between 0.02

μm and 0.03 μm (approximately equal to the descum width 21) and a depth in the range between about 400 Å and 700 Å.

Figure 4:
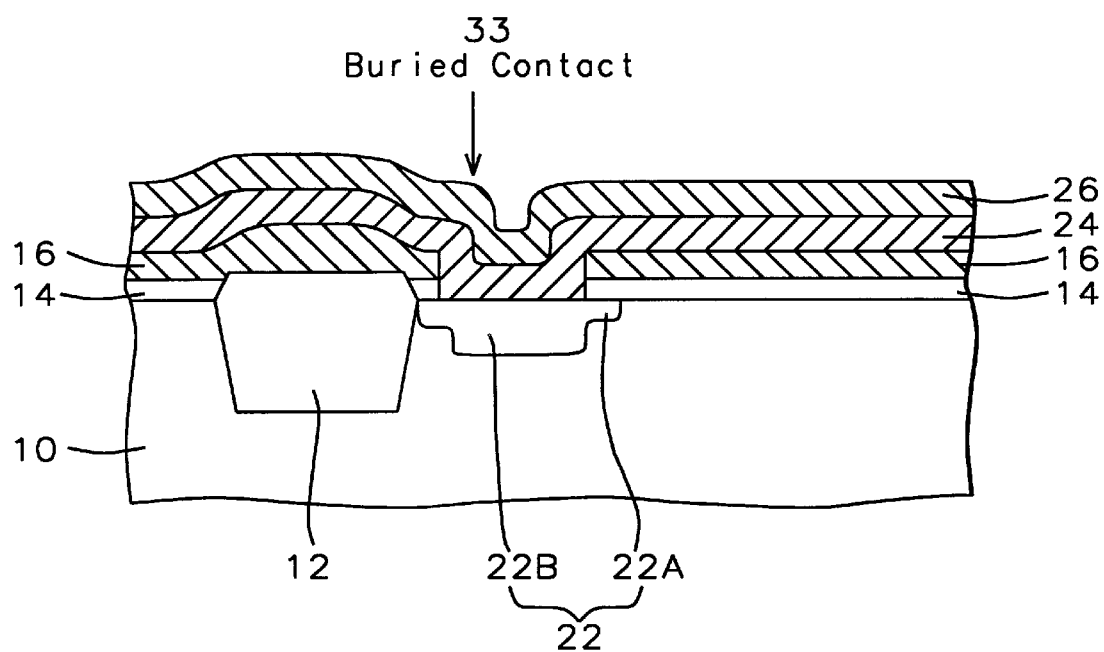

Referring to FIG. 4, the photoresist mask is removed using a conventional method. Next, a second conductive layer 24 is formed over the first conductive layer 16 and the exposed area 22B of the buried contact region 22. The second conductive layer is preferably composed of polysilicon. The second conductive layer 24 is preferably formed by a conventional low pressure chemical vapor deposition (LPCVD) to a thickness in a range between about 500 Å and 700 Å.

A polycide layer 26 is formed on the second conductive layer 24. The polycide layer 26 is preferably composed of tungsten silicide. After surfaces are cleaned using a hydrofluoric acid treatment, tungsten is deposited to a thickness in a range between about 1000 Å and 1100 Å using a sputtering process. The tungsten is caused to react with exposed polysilicon using a rapid thermal anneal (RTA) process at a temperature between about 750° C. and 850° C., for a period of time in a range between about 15 seconds and 45 seconds. Unreacted tungsten is removed using a solution of $H_2O_2$—$H_2SO_4$.

Figure 5:
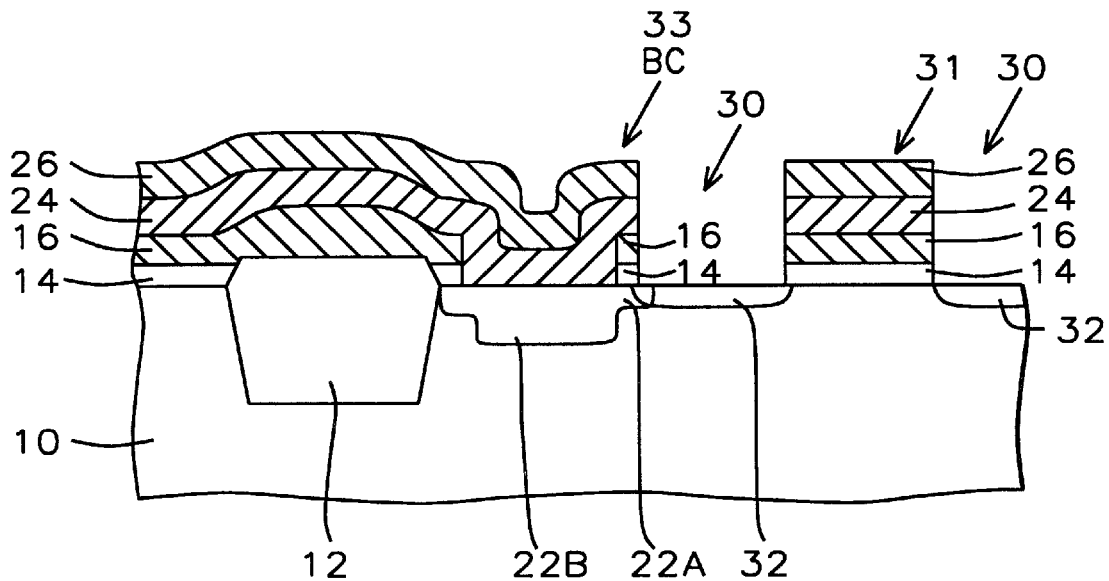

Referring to FIG. 5, the polycide layer 26, the second conductive layer 24, the first conductive layer 16, and the first insulating layer 14 are patterned to define a second opening 30 (e.g. LDD opening, gate etch opening). A photoresist mask (not shown) is formed thereover and the exposed layers are etched. The etch is a two step etch comprising (a) a polycide/polysilicon etch step (for layers 26, 24 &16) and (b) an oxide etch step (for layer 14). In the first (polycide/polysilicon) etch step, the subjacent first insulating layer 14 can act as an etch stop. The polycide layer 26, the second conductive layer 24, and the first conductive layer 16 are preferably removed using a RIE with chlorine. The second opening 30 defines a gate structure 31 and separates the contact structure 33.

A key advantage to the present invention is that the second opening 30 is located so that it partially overlaps the extended buried contact region 22A where the overlying first insulating layer 14 can act as an etch stop, thereby preventing overetching and buried contact trench formation which occurs if the substrate 10 is exposed to the polycide/polysilicon etch step.

The exposed first insulating layer is removed from the second opening 30 with dilute hydrofluoric acid or by REI with tetrafluoromethane ($CF_4$), thereby exposing a region of the substrate where an LDD will be formed.

Next, ions are implanted through the second opening 30 to form lightly doped source/drain regions 32. Another key advantage to the present invention is that because the second opening 30 partially overlaps the unexposed extended buried contact region 22A, the lightly doped source/drain region 32 merges with the buried contact 22. No undoped region remains in the conductive path to cause high resistance problems.

Figure 6:
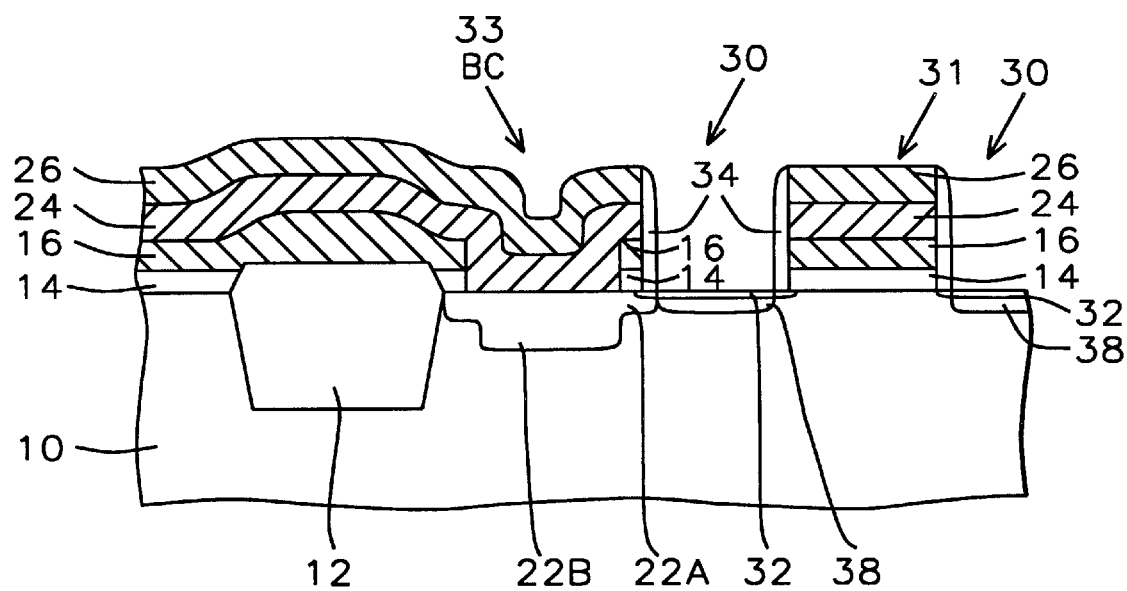

Referring to FIG. 6, spacers 34 are formed on the sidewalls of the gate structure 31 and the contact structure 33. Next, ions are implanted to form source/drain structures 38 as is conventional in the art. Device formation may proceed in a conventional manner as is well known in the art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating buried contacts comprising the steps of:
   a) forming isolation structures on a silicon substrate;
   b) forming a first insulating layer over said silicon substrate;
   c) forming a first conductive layer over said first insulating layer;
   d) forming a photoresist mask over said first insulating layer; said photoresist mask having a buried contact opening;
   e) etching said first conductive layer and said first insulating layer through said buried contact opening;
   f) descumming said photoresist mask; thereby forming an expanded opening; said expanded opening forming an exposed ring of said first conductive layer with subjacent first insulating layer;
   g) implanting impurity ions through said expanded opening forming a buried contact region; said impurity ions being implanted at a sufficient energy level to penetrate said exposed ring of said first conductive layer and said first insulating layer;
   h) removing said photoresist mask;
   i) forming a second conductive layer over said first conductive layer and over exposed region of said buried contact region;
   j) forming a polycide layer over said second conductive layer;
   k) patterning said polycide layer, said second conductive layer, said first conductive layer and said first insulating layer to form a second opening; said second opening defines a gate structure and a contact structure having sidewalls; said second opening parially overlaps said extended buried contact region;
   l) implanting ions through said second opening to form lightly doped source/drain regions;
   m) forming spacers on the sidewalls of said gate structure and said contact structure;
   n) implanting ions to form source/drain structures.

2. The method of claim 1 wherein the width of photoresist mask removed by the descum process is in the range between about 0.02 μm and 0.03 μm.

3. The method of claim 1 wherein the width of the expanded opening is in the range between about 0.45 μm and 0.50 μm.

4. The method of claim 1 wherein the impurity ions implanted to form the buried contact region are P ions implanted at an energy in the range between 70 KeV and 90 KeV, at a dose in the range between $10^{14}$ atoms/cm$^2$ and $10^{15}$ atoms/cm$^2$.

5. The method of claim 1 wherein the patterning of step k is performed using a two-step etch comprising a polycide/polysilicon wherein the portion of the first insulating layer overlying the extended buried contact region acts as an etch stop during etching of the polycide layer, the second conductive layer, and a second etch step is used to pattern the first conductive layer.

6. The method of claim 1 wherein said first conductive layer is composed of polysilicon having a thickness in the range between 500 Å and 700 Å; said second conductive layer is composed of polysilicon having a thickness in the range between 500 Å and 700 Å; said polycide layer is composed of tungsten suicide having a thickness in the range between 1000 Å and 1100 Å; and said first insulating layer is composed of silicon dioxide having a thickness in the range between 60 Å and 80 Å.

7. A method for fabricating buried contacts comprising the steps of:
   a) forming isolation structures on a silicon substrate;
   b) forming a first insulating layer over said silicon substrate;
   c) forming a first conductive layer over said first insulating layer;
   d) forming a photoresist mask over said first insulating layer; said photoresist mask having a buried contact opening;
   e) etching said first conductive layer and said first insulating layer through said buried contact opening;
   f) descumming said photoresist mask; thereby forming an expanded opening; said expanded opening forming an exposed ring of said first conductive layer with subjacent first insulating layer;
   g) implanting impurity ions through said expanded opening to form a buried contact region; said buried contact region comprising an extended buried contact region and an exposed area; said extended buried contact region extending under said exposed ring of said first conductive layer and said first insulating layer subjacent to said exposed ring of said first conductive layer; said exposed area being formed where said first conductive layer and said first insulating layer were previously removed;
   h) removing said photoresist mask;
   i) forming a second conductive layer over said first conductive layer and over exposed region of said buried contact region;
   j) forming a polycide layer over said second conductive layer;
   k) patterning said polycide layer, said second conductive layer, said first conductive layer and said first insulating layer to form a second opening; said second opening defines a gate structure and a contact structure having sidewalls; said second opening parially overlaps said extended buried contact region;
   l) implanting ions through said second opening to form lightly doped source/drain regions;
   m) forming spacers on the sidewalls of said gate structure and said contact structure;
   n) implanting ions to form source/drain structures.

8. The method of claim 7 wherein the width of photoresist mask removed by the descum process is in the range between about 0.02 μm and 0.03 μm.

9. The method of claim 7 wherein the width of the expanded opening is in the range between about 0.45 μm and 0.50 μm.

10. The method of claim 7 wherein the impurity ions implanted to form the buried contact region are P ions implanted at an energy in the range between 70 KeV and 90 KeV, at a dose in the range between $10^{14}$ atoms/cm$^2$ and $10^{15}$ atoms/cm$^2$.

11. The method of claim 7 wherein the patterning of step k is performed using a two-step etch comprising a polycide/polysilicon wherein the portion of the first insulating layer overlying the extended buried contact region acts as an etch stop during etching of the polycide layer, the second conductive layer, and a second etch step is used to pattern the first conductive layer.

12. The method of claim 7 wherein said first conductive layer is composed of polysilicon having a thickness in the range between 500 Å and 700 Å; said second conductive layer is composed of polysilicon having a thickness in the range between 500 Å and 700 Å; said polycide layer is composed of tungsten silicide having a thickness in the range between 1000 Å and 1100 Å; and said first insulating layer is composed of silicon dioxide having a thickness in the range between 60 Å and 80 Å.

* * * * *